US005469963A

United States Patent [19]
Bonora et al.

[11] Patent Number: 5,469,963
[45] Date of Patent: Nov. 28, 1995

[54] SEALABLE TRANSPORTABLE CONTAINER HAVING IMPROVED LINER

[75] Inventors: Anthony C. Bonora, Menlo Park; Frederick T. Rosenquist, Redwood City; Sudhir Jain, Milpitas, Calif.; Mark R. Davis, Campbell, all of Calif.

[73] Assignee: Asyst Technologies, Inc., Milpitas, Calif.

[21] Appl. No.: 865,297

[22] Filed: Apr. 8, 1992

[51] Int. Cl.⁶ .................................................. B65D 85/30
[52] U.S. Cl. .......................... 206/709; 206/454; 361/212
[58] Field of Search .................................. 141/98, 65, 67, 141/70, 85, 93; 414/217, 221, 222, 225, 226, 292, DIG. 5, DIG. 6; 250/441.11; 206/328, 334, 454, 455, 524.8; 118/500; 361/212

[56] References Cited

U.S. PATENT DOCUMENTS

| | | | |
|---|---|---|---|
| 3,605,826 | 9/1971 | Carter | 141/93 X |
| 4,458,291 | 7/1984 | Yanagisawa et al. | 206/328 X |
| 4,494,651 | 1/1985 | Malcolm | 206/328 |
| 4,616,683 | 10/1986 | Tullis et al. | 141/98 |
| 4,684,020 | 8/1987 | Ohlbach | 206/328 |
| 4,804,086 | 2/1989 | Grohrock | 206/328 |
| 4,815,912 | 3/1989 | Maney et al. | 414/217 |
| 4,865,197 | 9/1989 | Craig | 206/328 |
| 4,906,494 | 3/1990 | Babinec et al. | 206/328 X |
| 4,995,430 | 2/1991 | Bonora et al. | 141/98 |
| 5,024,329 | 6/1991 | Grohrock | 206/454 |

OTHER PUBLICATIONS

Pp. 15–16 of Marks' Standard Handbook For Mechanical Engineers, Baumeister et al., McGraw—Hill, N.Y. 1979.
*Adapting Military Technology to Civilian Use: Contamination Removal and Collection Techniques* by Steven P. Hotaling, USAF Rome Laboratory–*Microcontamination*, May 1993, pp. 21–27.

*Primary Examiner*—J. Casimer Jacyna
*Attorney, Agent, or Firm*—Fliesler, Dubb, Meyer & Lovejoy

[57] ABSTRACT

A transportable, sealable container, which has an improved pod liner. The container includes a box, a box door, and a gasket which forms a seal between the box and the box door. The box door has a conductive liner and a conductive path from the conductive liner to ground potential for electrostatic discharge protection. A membrane for isolating the gasket from the interior region of the container is bonded to the gasket and the conductive liner. The membrane may be impervious to gasses to prevent outgassing of the gasket or impervious to particles but not gasses to prevent particulate matter generated by the gasket from entering the interior region of the container.

25 Claims, 5 Drawing Sheets

SEALABLE TRANSPORTABLE CONTAINER HAVING IMPROVED LINER

CROSS-REFERENCE TO RELATED APPLICATIONS/PATENTS

This Application is related to the following Applications/Patents, all assigned to the assignee of the subject Application:

SHORT ARM MANIPULATOR FOR STANDARD MECHANICAL INTERFACE APPARATUS, U.S. Pat. No. 4,674,936;

SEALED STANDARD INTERFACE APPARATUS, U.S. Pat. No. 4,674,939;

LONG ARM MANIPULATOR FOR STANDARD MECHANICAL INTERFACE APPARATUS, U.S. Pat. No. 4,676,709;

SEALABLE TRANSPORTABLE CONTAINER HAVING A PARTICLE FILTERING SYSTEM, U.S. Pat. No. 4,724,874;

CONTAINER HAVING DISPOSABLE LINERS, U.S. Pat. No. 4,739,882;

BOX DOOR ACTUATED RETAINER, U.S. Pat. No. 4,815,912;

PROCESSING SYSTEMS WITH INTELLIGENT ARTICLE TRACKING, U.S. Pat. No. 4,974, 166;

SEALABLE TRANSPORTABLE CONTAINER HAVING IMPROVED LATCH MECHANISM, U.S. Pat. No. 4,995,430;

INTELLIGENT WAFER CARRIER, U.S. Pat. No. 5,097,421;

METHOD AND APPARATUS FOR TRANSFERRING ARTICLES BETWEEN TWO CONTROLLED ENVIRONMENTS, U.S. Pat. No. 5,169,272.

Each of these related Applications/Patents is incorporated herein by reference.

BACKGROUND OF THE INVENTION

1. Field of the Invention

The present invention relates to standardized mechanical interface (SMIF) systems for reducing particle contamination, and more particularly to transportable containers which are sealable to prevent influence of external factors on the contents of the containers, and which have a clean interior region.

2. Description of the Related Art

A standardized mechanical interface (SMIF) system proposed by the Hewlett-Packard Company is disclosed in U.S. Pat. Nos. 4,532,970 and 4,534,389. The purpose of a SMIF system is to reduce particle fluxes onto wafers and/or reticles. This purpose is accomplished, in part, by mechanically ensuring that during transportation and storage the gaseous media (such as air or nitrogen) surrounding the wafers is essentially stationary relative to the wafers and by ensuring that particles from the ambient environment do not enter the immediate wafer environment.

The SMIF concept is based on the use of a small volume of controlled (with respect to motion, gas flow direction and external contaminants), particle-free gas to provide a clean environment for articles.

Further details of one proposed system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, Jul. 1984, pp. 111–115.

Systems of the above type are concerned with particle sizes which range from below 0.1 µm to above 200 µm. Particles with these sizes can be very damaging in semiconductor processing because of the small geometries employed in fabricating semiconductor devices. Typical advanced semiconductor processes today employ geometries which are one micron (1 µm) and under. Unwanted contamination particles which have geometries measuring greater than 0.05 µm substantially interfere with 1 µm geometry semiconductor devices. The trend, of course, is to have smaller and smaller semiconductor processing geometries which today in research and development labs approach 0.5 m and below. In the future, geometries will become smaller and smaller and hence smaller and smaller contamination particles become of interest.

A SMIF system has three main components: (1) sealed pods, having a minimal volume, used for storing and transporting cassettes holding reticles or wafers; (2) enclosures placed over cassette ports and wafer processing areas of processing equipment so that the environments inside the pods and enclosures (after having clean air sources) become miniature clean spaces; and (3) a transfer mechanism to load/unload wafer cassettes from a sealed pod without contamination of the wafers in the wafer cassette from external environments.

Wafers are stored and transported in pods, and are transferred from a pod to processing equipment in the following manner. First, a pod is placed at the interface port on top of the enclosure. Each pod includes a box and a box door designed to mate with doors on the interface ports of the processing equipment enclosures. Then, latches release the box door and the enclosure port door simultaneously; the box door and the interface port door are opened simultaneously so that particles which may have been on the external door surfaces are trapped ("sandwiched") between the box and interface port doors. A mechanical elevator lowers the two doors, with the cassette riding on top, into the enclosure covered space. A manipulator picks up the cassette and places it onto the cassette port/elevator of the equipment. After processing, the reverse operation takes place.

The SMIF system has proven effective, both inside and outside a clean room, through use in semiconductor fabrication facilities and experiments. A SMIF system provides at least a ten-fold improvement over the conventional handling of open cassettes inside the clean room.

There are several areas in which conventional SMIF pods may be improved. First, conventional SMIF pods do not provide protection from electrostatic discharge (ESD). A contamination constraint is created by the need for conductivity; in molded plastic materials the preferred and most common ingredient for providing volumetric conductivity is carbon powder or fiber. Unfortunately, this material tends to slough off during sliding contact with another surface even if the surrounding plastic remains intact. Generation of particles in this manner is undesirable as they are likely to be transferred to many locations during normal cassette transfer and may ultimately migrate to wafer surfaces.

Second, the materials used to construct injection molded products and seals may release, through outgassing, materials which interfere with critical device fabrication processes. In this regard, studies with current generation 150 mm SMIF-Pods have shown significantly less surface contamination on wafers stored in pods than on wafers stored in ULPA filtered recirculating air-systems. Nevertheless, the materials approach used in pod construction can benefit from attention to internal outgassing sources. Third, particle generation: In the course of normal production processing, a cassette of wafers will be loaded/unloaded from a SMIF-pod several hundred times, and will be subjected to many transport and placement operations. Each of these operations, as well as pod opening/closing, can generate particles, particularly where contact occurs between the cassette and supporting/retaining surfaces on the pod door.

Fourth, sealing: the functional importance of sealing the SMIF-Pod door has historically been based upon the requirement of providing a still-air environment for the wafers, to prevent cumulative particulate and surface contamination conditions generated by the numerous air changes per minute and other transient conditions in the general clean room. In many tests conducted on SMIF-Pods it has been determined that a "proximity" seal is adequate for excluding particulate sizes above approximately 0.5 μm, but a heavy concentration of smaller particles can in fact diffuse across small air gaps and eventually result in wafer surface contamination. Accordingly, a volume-compressible seal was incorporated in conventional pods to preclude diffusion-based particulate transfer. Subsequently, the development of SMIF-Based systems utilizing a controlled atmosphere condition for the pod and port-plate components has added additional requirements to sealing performance.

Conventional seals are formed using a poromeric, volume compressible material which is fundamentally a polyurethane foam of controlled porosity and durometer. This material was developed for use in applications such as disk drive gasketing, clean room filters and cabinet assemblies. Cycle testing has shown that this material had excellent properties in terms of compression set, resistance to abrasion and particulation, and dimensional accuracy. Nevertheless, trace gas analysis results now indicate that outgassing from this seal is excessive for certain (e.g., 64 Mb) type product applications.

Fifth, cleaning: Historically, cleaning of SMIF pods has been performed in a manner similar to that used for other semiconductor handling products using a combination of deionized wafer and a non-ionic surfactant followed by thorough rinsing and air drying. Based on SMIF-user experience to date, this has been an effective approach for particle build-up control down to at least the 0.3 μm level.

Future trends, however, point to the need for a cleaning approach which could provide improved levels of cleanliness for smaller particles as well as minimizing any possibility of introducing contamination during cleaning, i.e. organics, particles and residual moisture. Several new technologies have recently emerged that could enable a "dry" cleaning process to be used for pod component cleaning. An improved cleaning system would also ideally be compact enough to be located in the Fab area itself. Appropriate design of the internal pod elements and the cleaning system would facilitate cleaning with a minimum of human interaction for disassembly/reassembly.

SUMMARY OF THE INVENTION

It is, therefore, an object of the present invention to provide an improved SMIF pod.

Another object of the present invention is to provide a SMIF based handling system which provides ESD control; in particular, an environment in which a conductive cassette can be maintained at ground potential during storage, pod opening, gripper transfer, and placement on process equipment.

Another object of the present invention is to provide a pod molded of a material exhibiting volume conductivity qualities.

Another object of the present invention is to provide a path for conducting any charge which may be present on the wafers and/or cassette to ground with a path of predictable resistance.

Another object of the present invention is to provide a pod in which the materials of pod construction, particularly those in immediate contact with cassette or wafers, are either conductive or not susceptible to charge build-up.

Another object of the present invention is to provide a sealing approach for a SMIF pod which can ultimately meet one or more of the following requirements: effective barrier to particle intrusion; non-particle generating during repetitive cycling; non-outgassing relative to balance of system components; low level of compression set during extended storage or repetitive cycling; non-porous to prevent gaseous diffusion; and secure gas-tight sealing.

These and other objects of the present invention are provided by proper material choices for the wafer cassette and its corresponding support/contact surfaces in the SMIF pod. Preferred combinations would be those that mate a hi-lubricity non-sloughing cassette material against a smooth finished relatively hard pod door upper surface. ESD protection is provided by utilizing a conductive liner on the pod door which provides a low resistance path to the pod door from a conductive cassette. The pod door includes a conductive path to ground potential.

A membrane is provided over the conductive liner and is bonded to the conventional sealing gasket. The membrane has an opening to allow the wafer cassette to sit on the conductive liner. The membrane isolates the gasket from the interior of the pod, thereby eliminating the gasket as a contamination source. The conductive liner, preferably formed of stainless steel, replaces conventional vacuum formed PVC liners and reduces outgassing from conventional plastic liners. The smooth, hard finish of the conductive liner minimizes particle generation at the cassette contact areas.

In particular, the present invention relates to a sealable, transportable container, comprising: a pod having an interior region and a sealing surface; a pod door having an interior surface; an electrically conductive liner provided on said interior surface of said pod door; a gasket provided on said pod door, said gasket having a configuration corresponding to the configuration of said sealing surface of said pod; a membrane overlying and bonded to said electrically conductive liner and said gasket, said membrane having an opening which exposes said conductive liner; and latch means for securing said pod door to said pod.

These and other objects and advantages of the invention will appear more clearly from the following description in which the preferred embodiments of the invention have been set forth in detail in conjunction with the drawings.

DESCRIPTION OF THE PREFERRED EMBODIMENTS

The present invention will be described in the context of a SMIF system for storing and transporting wafers and/or reticles. However, it is to be understood that a sealable, transportable container in accordance with the present invention may be used to store and transport many other inanimate objects, as well as living objects such as laboratory animals.

The general structure of a SMIF pod and the mating of a SMIF pod with processing equipment are described in U.S. Pat. No. 4,724,874 which is hereby incorporated by reference. However, for completeness, a brief description of the disclosure is provided herein.

Figures 1A, 1B:
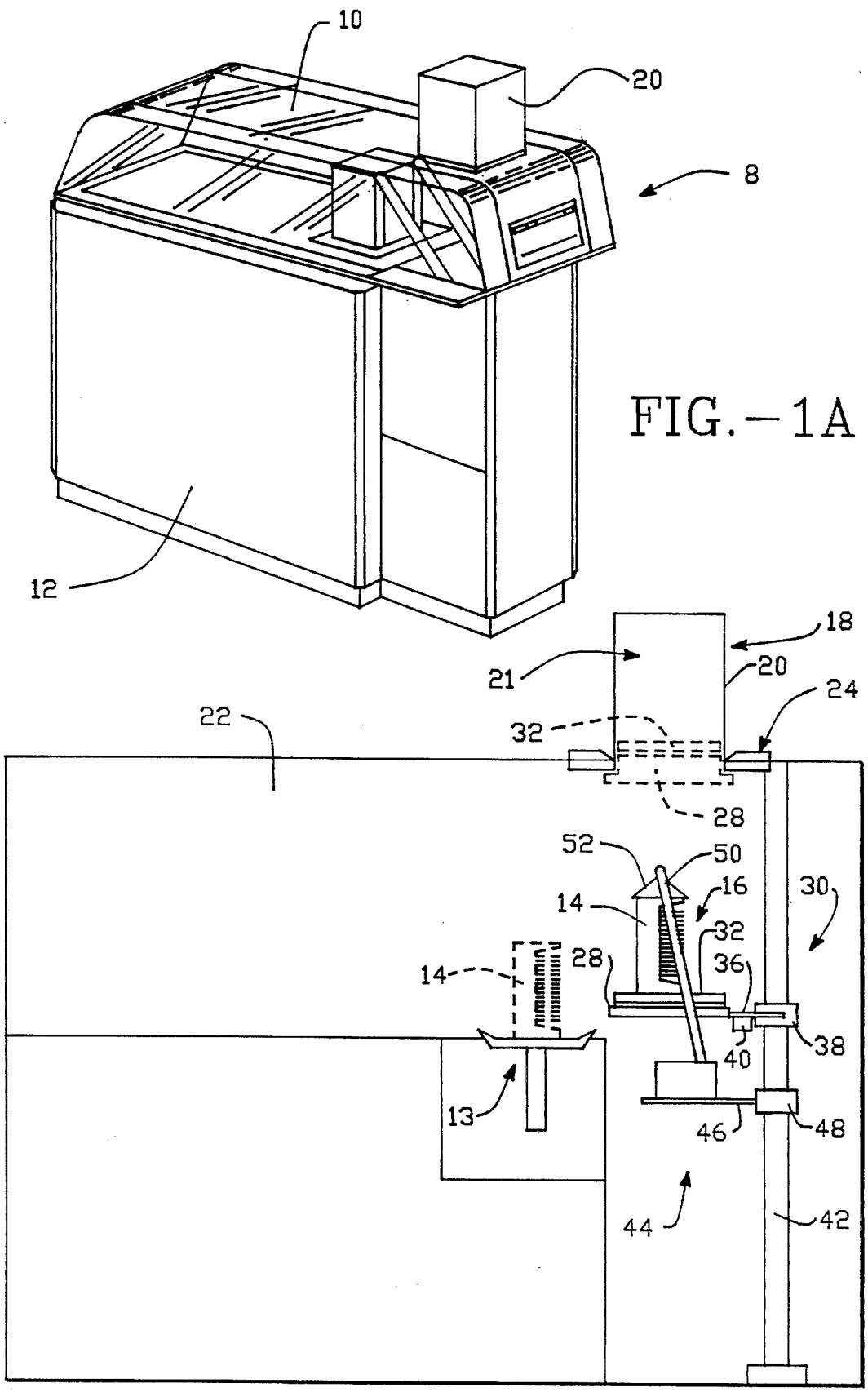
FIG. 1A is an isometric view of a processing station having a canopy for receiving a SMIF pod.
FIG. 1B is a cutaway side view of the processing station of FIG. 1.

FIGS. 1A and 1B illustrate a processing station 8 having an enclosure 10 which is an easily removable shield that covers the wafer handing mechanism of processing equipment 12. Equipment 12 may be, for example, a photo resist applicator, mask aligner, inspection station or any similar processing equipment. The enclosure 10, which is constructed of transparent plastic, such as acrylic, to facilitate visual inspection and/or maintenance within the enclosure 10, covers the handling mechanisms of the processing equipment 12 and a holder 14, such as a wafer cassette holding wafers 16. The environment within the processing equipment is separately maintained and separately cleaned, and therefore the equipment 12 need not be installed in a clean room.

Sealable, transportable container 18 includes a box (alternatively identified as a box top or a pod) 20 having an interior region 21 and a box door (or pod door) 32. Container 18 is mounted on the horizontal surface 22 of enclosure 10 by a port assembly 24. The port assembly 24 includes a port plate 26, port door 28, and an elevator mechanism 30. Elevator mechanism 30 transports a wafer cassette 14, containing integrated circuit wafers 16, from the interior region 21 of box 20 into the region beneath the enclosure 10. In FIG. 1B, port door 28 and box door 32 are shown in the closed position by the dotted lines. A elevator mechanism 30 includes a platform 36, a shaft engagement device 38 and a drive motor 40. The platform 36, extending from the elevator assembly 30, carries the port door 28, the box door 32 and cassette 14 in a vertical direction. The platform 36 is attached by engagement device 38 to a vertical guide 42 of elevator assembly 30.

Typically, guide 42 includes a lead screw (not shown) and the drive motor 40 drives a gear (not shown) which engages the lead screw for driving the platform 36 up or down. When the platform 36 is driven to the closed position, the port door 28 closes the port opening in the enclosure 10.

In a similar manner, the manipulator assembly, shown generally by the numeral 44, is fastened to a platform 46 which has an engagement means 48 for engaging the vertical guide 42. Manipulator assembly 44 includes a manipulator arm 50 and an engagement head 52 adapted to engage cassette 14. By vertical operation of the platforms 36 and 46 and by operation of the manipulator assembly 44, cassette 14 is moved from its position on the box door 32 to a position on the equipment station 13 (as shown by the broken lines).

Figure 2:
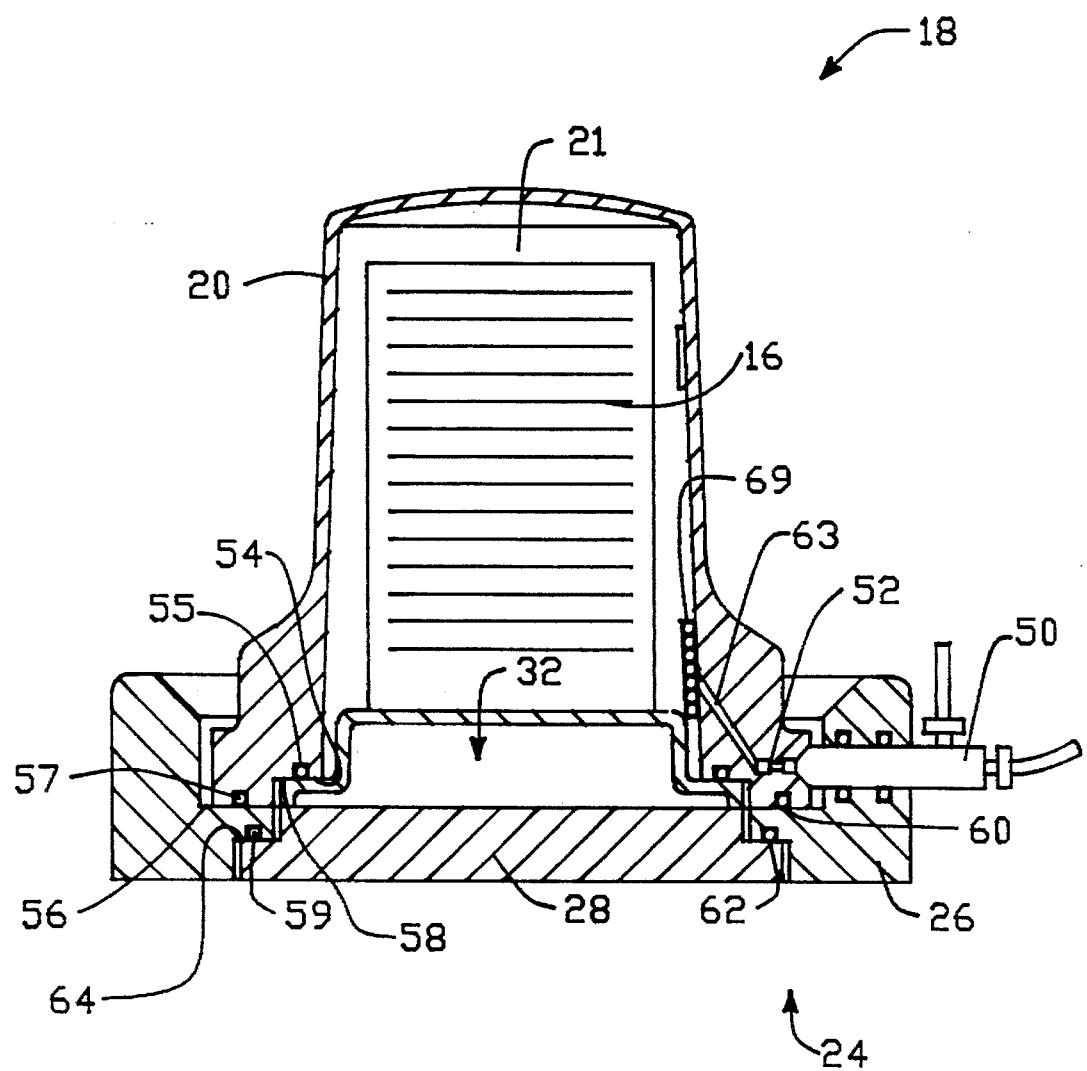
FIG. 2 is a sectional view of a SMIF pod and portions of a port assembly for receiving the SMIF pod.

FIG. 2 shows container 18 mated to port assembly 24 of processing equipment 12. Container 18 is designed for sealably mating with the port assembly 24, and thus box 20 has first and second box top sealing surfaces 54, 56, respectively. Box door 32 has a first box door sealing surface 58 for sealably mating with the first box top sealing surface 54, and gasket 55 between surfaces 54 and 58 provides a seal. Port plate 26 has first and second port plate sealing surfaces 60, 62, respectively. The first port plate sealing surface 60 sealably mates with the second box top sealing surface 56, making a second seal as gasket 57 is compressed.

Port door 28 has a first port door sealing surface 64 which sealably mates with the second port plate sealing surface 62; a third seal is provided by gasket 59. The box top 20 may include a conduit (channel) 63 defining a channel between valve 52 and the interior space 21 of box 20. At one end of channel 63 is a filter 69 for filtering fluids (e.g., gasses) passing therethrough.

When the first, second and third seals are made, the interior space 21 of box 20 may cleaned by alternately evacuating/back-filling the interior space 21. Container 18 can be alternately back-filled or evacuated when box 20 and box door 32 are sealed together to isolate the interior region of box 21 from ambient conditions.

Co-pending application Ser. No. 07/607,898, filed Nov. 1, 1990, which is incorporated herein by reference, discloses an apparatus and a method for transferring articles from a SMIF pod to a processing station or transferring articles from a processing station to a SMIF pod in which the environment inside the SMIF pod is purged before this environment is exposed to the atmosphere inside the processing station. One manner of purging the SMIF pod is to create a non-contact gas seal by opening the port door of the processing station by a small amount and to create a differential pressure with respect to the pressure in the SMIF pod. The differential pressure is defined as the relationship of the relative pressures in the SMIF pod, the processing station, a gas inlet to the port assembly of the processing station, and a gas outlet form the port assembly. The differential pressure causes the gas inside the processing equipment to escape through the small aperture between the port door and the processing station, thereby preventing gas from entering the interior region of the processing station through the non-contact gas seal. In conjunction with providing the gas seal, a reduced pressure is created in the port region of the processing equipment in order to remove contaminates and the gas from both the pod door and the interior region of the pod as the pod is opened. The gas seal is maintained until the purging of the interior environment of the SMIF pod is completed. The pod loading or unloading operation includes lowering the pod door to a first position to open the pod and to allow the atmosphere inside the pod door to be purged, lowering the pod door to a second position to allow the interior region of the pod to be purged, and lowering the pod door to a third position in which materials may be transferred to or from the pod.

Port plate 26 is connectable to a coaxial injector/extractor 50 at gas transfer valve 52. In order to evacuate interior space 21, injection/extractor 50 is activated to withdraw fluid from interior space 21. As the fluids are withdrawn, they pass through filter 69, through channel 63 and through a coaxial valve (not shown) of injection/extractor 50.

Figure 3:
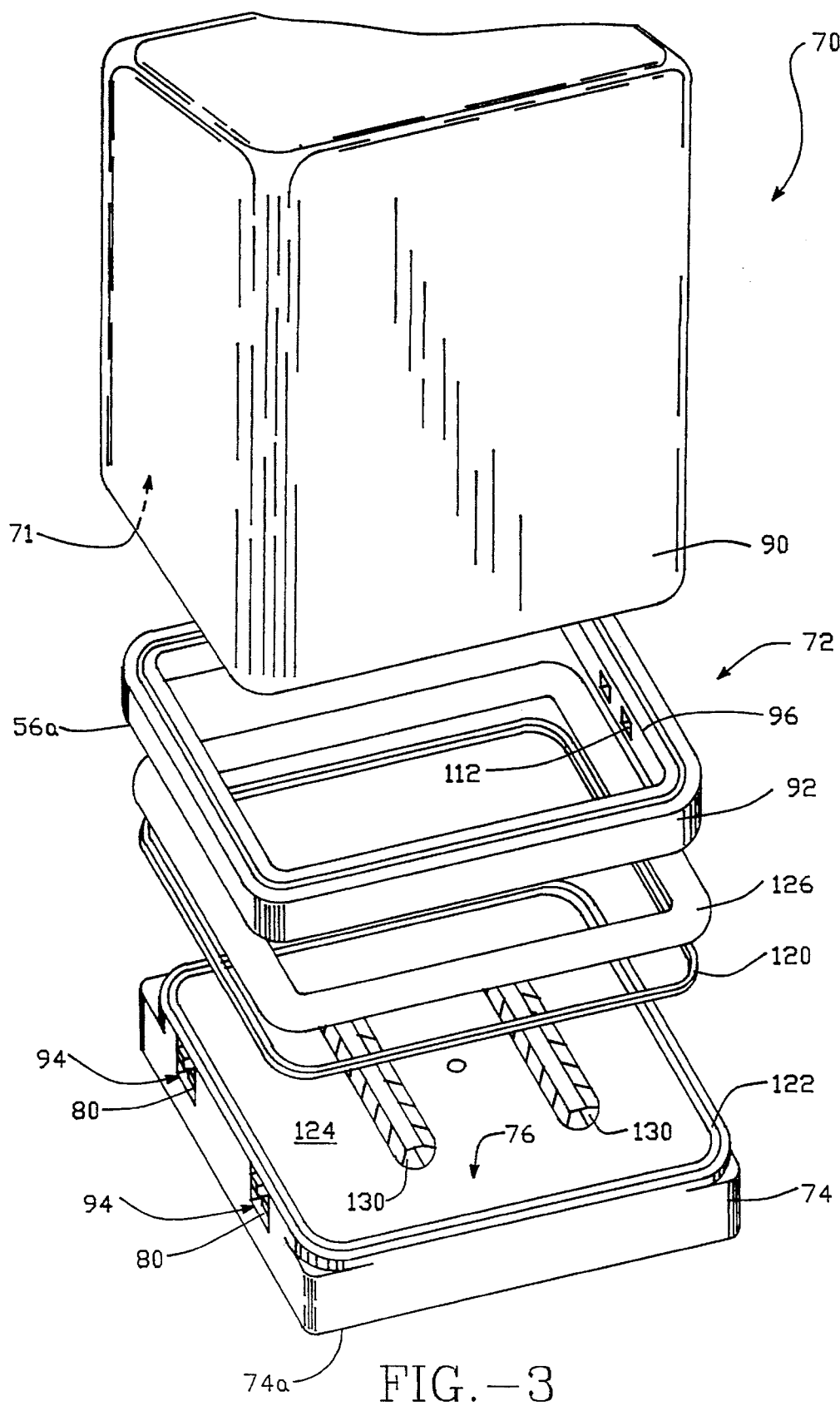
FIG. 3 is an isometric, exploded view of a SMIF pod in accordance with the present invention.

FIG. 3 shows a container 70 which is similar to container 18 of FIGS. 1–2, but with an alternative sealing 70 includes box 72 and box door 74. That is, the embodiment in FIG. 3 is a SMIF pod similar to the embodiment of FIGS. 1–2, with the exception that seal 55 is replaced by the alternative sealing arrangement shown in more detail in FIG. 5 and the addition of the conductive liner. Container 70 includes box 72 and box door 74. Box 72 comprises a domed housing 90 and a ring-like engaging portion 92. Housing 90 and engaging portion 92 may be formed integrally, for example, by injection molding, or as separate components assembled to form box 72. A gasket 120, which provides the seal between box 72 and box door 74 resides in a gasket-retaining slot 122 in box door 74. A latch mechanism (not shown) is housed in box door 74 latch mechanism 80 protrudes from box door 74 through windows 94 to engage latch engaging surfaces 112 of box 72. Engaging portion 92 has a knife edge 96 shown in detail in FIG. 5. Bottom surface 56a of engaging portion 92 is analogous to sealing surface 56 shown in FIG. 2, which is adapted to form a seal with first port plate surface 60. Bottom 74a of box door 74 will come into contact with the port door when the container is placed on top of the port. Thus, container 70 is adapted to interface with a SMIF port, as described above.

Figure 4:
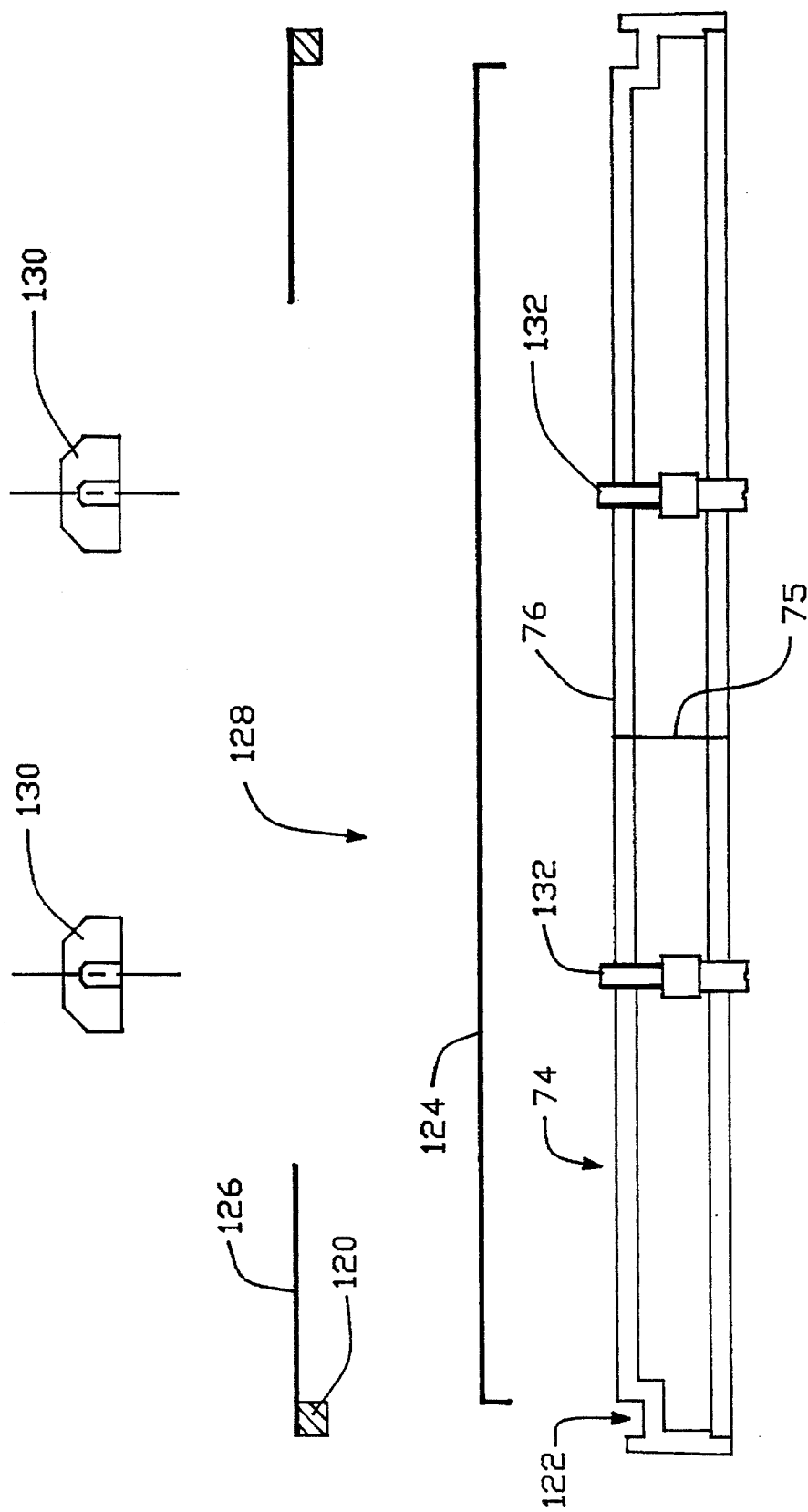
FIG. 4 is an exploded, schematic, sectional view of a pod door in accordance with the present invention.

The liner structure for a SMIF pod in accordance with the present invention will be described with reference to FIGS. 3 and 4. Box door 74 has an interior surface 76, which defines the portion of box door 74 exposed to interior region 71 of pod 72. A conductive liner 124 is provided on interior surface 76 of box door 74. The conductive liner may be formed of, for example, stainless steel or conductive plastic. The conductive liner 124 provides a clean (low outgassing, low particle generation, non-corrosive), conductive support surface for cassette 14. A stainless steel liner 124 provides excellent conductivity and has low particle generation and outgassing characteristics. Conductive liner 124 is electrically connected to box door 74, and box door 74 includes a conductive path which is connected to a fixed potential, e.g., ground potential, external to the box 72. The conductive path through box door 74 may be provided by forming the box door 74 of conductive materials, or providing a conductor, e.g. wire 75, in box door 74.

A membrane 126 is laminated or bonded to gasket 120 and conductive liner 124 in order to isolate gasket 120 from the interior region 71 of box 72. In the preferred embodiment, membrane 126 is formed of fluoroplastic and has a configuration which corresponds to the shape of gasket 120 and the periphery of box door 74, exposing the center of conductive liner 124 through opening 128. A fluoroplastic membrane is impervious to gasses, preventing outgassing of the gasket into the interior region 71 of box 72. Materials which may be used to fabricate membrane 126 include, for example, tetrafluoroethylene or polytetrafluoroethylene (Teflon™), polyamide (Kapton™), polyester (Mylar™), polypropylene, or an expanded fluoroplastic (Gore-Tex™). An expanded fluoroplastic membrane would be impervious to particles but not gasses, and thus would prevent particulate matter generated by the gasket from entering the interior region of the container.

Cassette retainer blocks 130 are fastened to box door 74 by retainer screws 132. Cassette retainer blocks 130 provide a clamping force, through retainer screws 132, which holds conductive liner 124 in place. Cassette retainer blocks 130 function to position cassette 14 while cassette 14 rests on conductive liner 124.

Figure 5:
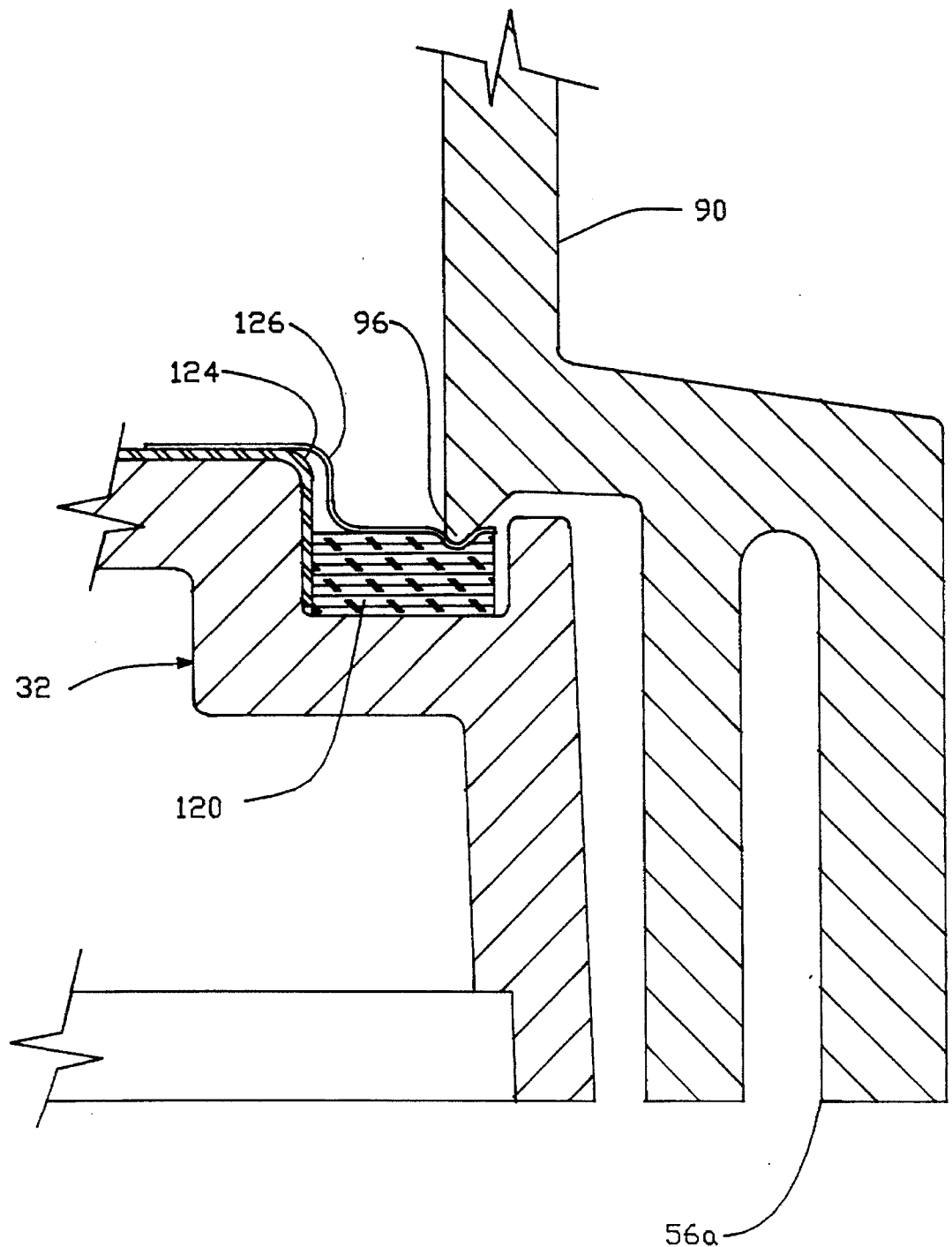
FIG. 5 is a partial, sectional view showing the interface of a pod and a pod door in a SMIF pod in accordance with the present invention.

As shown in FIG. 5, pod 90 has a knife edge 96 which compresses membrane 126 and gasket 120 in order to provide a seal between the box 72 and the box door 74. Membrane 126 prevents gasket 120, which is usually formed of a poromeric material, from outgassing into the interior region 71 of box 72.

The many features and advantages of the present invention will be apparent to those skilled in the art from the Description of the Preferred Embodiments and the Drawings. Accordingly, the following claims are intended to cover all modifications and equivalents falling within the scope of the invention.

What is claimed is:

1. A sealable, transportable container for an article, comprising:

a pod having an interior region and a sealing surface;

a pod door having an interior surface and an exterior surface, said pod door including an electrical conductor extending from the interior surface to the exterior surface;

an electrically conductive liner provided on said interior surface of said pod door adapted to remove electric charge from the article said liner connected to said conductor;

a gasket provided on said pod door;

a membrane overlying and attached to said electrically conductive liner and having an opening which exposes a portion of said conductive liner, a portion of said membrane overlying said gasket, said sealing surface of said pod adapted to mate with said portion of said membrane and compress said gasket to provide a seal; and a latch for securing said pod door to said pod.

2. sealable, transportable container according to claim 1, wherein said electrical conductor comprises a wire.

3. A sealable, transportable container according to claim 1, wherein:

said conductive liner comprises stainless steel;

said gasket comprises a poromeric material; and said membrane comprises a fluoroplastic.

4. A sealable, transportable container according to claim 1, wherein:

said conductive liner comprises stainless steel;

said gasket comprises a poromeric material; and said membrane comprises a polyamide.

5. A sealable, transportable container according to claim 1, wherein said membrane is bonded to said electrically conductive liner.

6. A sealable, transportable container according to claim 1, wherein said article is a cassette, said container further comprises:

a cassette positioning guide overlying said conductive liner, and means for connecting said positioning guide to said pod door.

7. A sealable, transportable container according to claim 1, wherein said seal isolates said interior region from ambient pressure conditions.

8. A sealable, transportable container according to claim 1, wherein said liner supports said article.

9. A sealable, transportable container for holding a cassette, comprising a pod having an interior region and a sealing surface;

a pod door having an interior surface;

an electrically conductive liner provided on said interior surface of said pod door adapted to remove electric charge from the article;

a gasket provided on said pod door;

a membrane overlying and attached to said electrically conductive liner and having an opening which exposes a portion of said conductive liner, said membrane overlying said gasket said sealing surface of said pod adapted to mate with said portion of said membrane and compress said gasket to provide a seal;

a latch for securing said pod door to said pod; and a cassette guide connected to said pod door and overlying said conductive liner.

10. A sealable, transportable container for receiving a cassette adapted to hold articles, comprising:

a pod having an interior region for housing the cassette and a sealing surface;

a pod door having an interior surface;

an electrically conductive liner provided on said interior surface of said pod door, said conductive liner having a cassette receiving region, said liner removing electric charge from said cassette when said cassette is received by said cassette receiving region;

a gasket overlying a portion of said interior surface of said pod door;

a membrane overlying and attached to said electrically conductive liner and having an opening which exposes said cassette receiving region of said conductive liner, said membrane overlying said gasket so that when said pod door is moved in a sealing direction with respect to said pod, said sealing surface of said pod mates with a portion of said membrane overlying said gasket and comprises said gasket to provide a seal which isolates said interior region from ambient pressure conditions;

a cassette guide overlying said cassette receiving portion of said conductive liner;

means for connecting said cassette guide to said pod door; and a latch adapted to secure said pod door to said pod.

11. A sealable, transportable container according to claim 10, further comprising a conductor which electrically interconnects said conductive liner with an electrical path external to said interior region of said pod.

12. A sealable, transportable container according to claim 10, wherein said pod door electrically interconnects said conductive liner with a fixed potential external to said interior region of said pod.

13. A sealable, transportable container according to claim 10, wherein:

said conductive liner comprises stainless steel;

said gasket comprises a poromeric material; and said membrane comprises a fluoroplastic.

14. A sealable, transportable container according to claim 10, wherein:

said conductive liner comprises stainless steel;

said gasket comprises a poromeric material; and said membrane comprises a polyamide.

15. A sealable, transportable container according to claim 10, wherein:

said conductive liner comprises stainless steel;

said gasket comprises a poromeric material; and said membrane comprises a polyester.

16. A sealable, transportable container according to claim 10, wherein:

said conductive liner comprises stainless steel;

said gasket comprises a poromeric material; and said membrane comprises polypropylene.

17. A sealable, transportable container according to claim 10, wherein said liner supports said cassette.

18. A standardized mechanical interface (SMIF) pod for an article, comprising:

a box having an interior region and a first sealing surface;

a box door having an interior surface and a second sealing surface, said box door adapted to mate with said box to form a seal between said first sealing surface and said second sealing surface isolating said interior region from ambient atmospheric conditions;

an electrically conductive liner provided on said interior surface of said box door for supporting said article and for removing electric charge from said article when said liner is supporting said article; and a conductor in said box door adapted to electrically interconnect said conductive liner with a fixed potential external to said interior region of said pod.

19. A SMIF pod according to claim 18, wherein said conductor is a wire.

20. A SMIF pod according to claim 18, wherein said conductive liner comprises stainless steel.

21. A SMIF system for maintaining the cleanliness of an article to be processed, comprising:

a container defining an interior space for containing the article, comprising:

a box having first and second box top sealing surfaces, a box door having an interior surface and a box door sealing surface, an electrically conductive liner provided on said interior surface of said box door for removing electric charge from said article, a conductor in said box door adapted to electrically interconnect said conductive liner with a fixed potential external to said interior space of said container, a gasket provided on said box door sealing surface, and a membrane overlying and attached to said electrically conductive liner and having an opening which exposes said conductive liner, a portion of said membrane overlying said gasket, said portion of said membrane overlying said gasket adapted to mate with said first box top sealing surface and compress said gasket to provide a first seal which isolates said interior region from ambient conditions when said box door is moved in a sealing direction with respect to said box; and a port, comprising a port plate having first and second port plate sealing surfaces, said first port plate sealing surface sealably mating with the second box top sealing surface for making a second seal, and a port door having a first port door sealing surface for sealably mating with the second port plate sealing surface for making a third seal.

22. A SMIF system according to claim 21, wherein:

said conductive liner comprises stainless steel;

said gasket comprises a poromeric material; and said membrane comprises a fluoroplastic.

23. A SMIF system according to claim 21, wherein:

said conductive liner comprises stainless steel;

said gasket comprises a poromeric material; and said membrane comprises a polyamide.

24. A standard mechanical interface (SMIF) pod for interfacing with a port, the port including a port plate and a port door, the port plate having a first port plate sealing surface and a second port plate sealing surface, the port door having a port door sealing surface, the first port plate sealing surface adapted to mate with the first port door sealing surface to form a seal between the port door and the port plate, said pod comprising:

a box having first and second box top sealing surfaces, said first box top sealing surface adapted to mate with said second port plate sealing surface;

a box door having a box door sealing surface, said box door sealing surface adapted to mate with said second box top sealing surface;

an electrically conductive liner provided on said interior surface of said box door for removing electric charge from said article; and a conductor in said box door adapted to electrically interconnect said conductive liner with a fixed potential external to said box.

25. A SMIF pod according to claim 24 wherein said conductive liner comprises stainless steel.

* * * * *

UNITED STATES PATENT AND TRADEMARK OFFICE
CERTIFICATE OF CORRECTION

PATENT NO.   : 5,469,963
DATED        : November 28, 1995
INVENTOR(S)  : Bonora, et. al.

It is certified that error appears in the above-indentified patent and that said Letters Patent is hereby corrected as shown below:

Col. 6, line 67, through Col. 7, line 1, delete the words "70 includes box 72 and box door 74." and substitute therefor --arrangement between the box top and the box door.--

Col. 7, line 13, after "74" and before "latch", insert --and--

Col. 7, line 27, delete "pod" and substitute therefor --box--

Signed and Sealed this

Twenty-third Day of April, 1996

Attest:

BRUCE LEHMAN

Attesting Officer

Commissioner of Patents and Trademarks